United States Patent
Cical et al.

(10) Patent No.: US 10,505,444 B1
(45) Date of Patent: Dec. 10, 2019

(54) VOLTAGE DIVIDER AND METHOD OF IMPLEMENTING A VOLTAGE DIVIDER

(71) Applicant: Xilinx, Inc., San Jose, CA (US)

(72) Inventors: Ionut C. Cical, Saggart (IE); Diarmuid Collins, Dunshaughlin (IE); Edward Cullen, Naas (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/152,165

(22) Filed: Oct. 4, 2018

(51) Int. Cl.
*H02M 3/07* (2006.01)
*H03K 5/24* (2006.01)
*H03H 19/00* (2006.01)
*H03K 19/0185* (2006.01)
*H03M 1/12* (2006.01)
*G11C 16/12* (2006.01)

(52) U.S. Cl.
CPC ............ *H02M 3/07* (2013.01); *H03H 19/004* (2013.01); *H03K 5/2472* (2013.01); *H03K 19/018585* (2013.01); *H03M 1/12* (2013.01); *G11C 16/12* (2013.01); *H02M 2003/072* (2013.01)

(58) Field of Classification Search
CPC ................................................ H02M 2003/072
See application file for complete search history.

(56) References Cited

U.S. PATENT DOCUMENTS

| | | | |
|---|---|---|---|
| 6,094,063 A | 7/2000 | St. Pierre, Jr. et al. | |
| 7,297,982 B2 | 11/2007 | Suzuki et al. | |
| 7,336,755 B1 | 2/2008 | Tetzlaff | |
| 7,995,364 B2 * | 8/2011 | Shiu | H02M 3/07 363/124 |
| 8,093,762 B2 * | 1/2012 | Takai | H02M 3/07 307/115 |
| 9,007,096 B1 | 4/2015 | Carey et al. | |
| 9,325,489 B2 | 4/2016 | Hsieh et al. | |
| 9,929,646 B2 * | 3/2018 | Notoya | H02M 3/07 |

* cited by examiner

*Primary Examiner* — Jeffery S Zweizig
(74) *Attorney, Agent, or Firm* — John J. King

(57) ABSTRACT

A voltage divider is described. The voltage divider comprises a pair of input nodes for receiving an input signal; a pair of output nodes configured to generate an output signal; a first capacitor having a first terminal coupled to a first output node of the pair of output nodes and a second terminal coupled to a second output node of the pair of output nodes; and a second capacitor having first terminal and a second terminal; a bypass switch having a first terminal coupled to the first terminal of the second capacitor and a second terminal coupled to the second terminal of the second capacitor; and a charge sharing switch coupled to the second terminal of the second capacitor; wherein the bypass switch and the charge sharing switch enable the sharing of charge between the first capacitor and the second capacitor.

18 Claims, 4 Drawing Sheets

--Prior Art--

VOLTAGE DIVIDER AND METHOD OF IMPLEMENTING A VOLTAGE DIVIDER

TECHNICAL FIELD

The present invention relates generally to integrated circuit devices, and in particular, to a voltage divider for and a method of implementing a voltage divider in an integrated circuit device.

BACKGROUND

The requirement to step down DC voltages frequently arises in electronics. Two conventional ways to achieve this include using a resistor divider or using a switched capacitor divider. A temperature coefficient and poor supply rejection of resistor dividers introduce errors in the output. In addition, a resistor divider cannot be used for voltage division in a sampled system. That is, high precision sampled systems (e.g. high-resolution data converters) require switched capacitor dividers to step down DC voltages.

However, conventional switched capacitor dividers suffer from significant leakage when both charging or discharging a sampling capacitor. Dominant leakage mechanisms include reverse biased leakage through the source-to-bulk (S/B) or the drain-to-bulk (D/B) diodes (which results in leakage onto the sampling capacitor) and channel leakage through the discharge switch (which results in leakage off the sampling capacitor). As the net leakage constitutes a nondeterministic error source, it cannot be calibrated out, thus making the reduction of the capacitor leakage significant in implementing high precision sampled systems.

Accordingly, there is a need for a voltage divider and a method of implementing a voltage divider overcoming the deficiencies of conventional voltage dividers.

SUMMARY

A voltage divider is described. The voltage divider comprises a pair of input nodes for receiving an input signal; a pair of output nodes configured to generate an output signal; a first capacitor having a first terminal coupled to a first output node of the pair of output nodes and a second terminal coupled to a second output node of the pair of output nodes; and a second capacitor having first terminal and a second terminal; a bypass switch having a first terminal coupled to the first terminal of the second capacitor and a second terminal coupled to the second terminal of the second capacitor; and a charge sharing switch coupled to the second terminal of the second capacitor; wherein the bypass switch and the charge sharing switch enable the sharing of charge between the first capacitor and the second capacitor.

A method of implementing a voltage divider is also described. The method comprises receiving an input signal at a pair of input nodes; generating an output signal at a pair of output nodes; coupling a first terminal of a first capacitor to a first output node of the pair of output nodes; coupling a second terminal of the first capacitor to a second output node of the pair of output nodes; coupling a first terminal of a bypass switch to a first terminal of a second capacitor; coupling a second terminal of the bypass switch to a second terminal of the second capacitor; and coupling a charge sharing switch to the second terminal of the second capacitor; wherein the bypass switch and the charge sharing switch enable the sharing of charge between the first capacitor and the second capacitor.

DETAILED DESCRIPTION

The circuits and methods described below provide a switched capacitor divider architecture for an integrated circuit to minimize leakage. The circuit arrangement effectively eliminates leakage off a sampling capacitor due to channel leakage through a discharge switch by providing a high impedance connection to the discharge switch from the output when it is ready to be sampled. Also, by reducing the bulk voltage of the sampling switch to within a safe margin of the output voltage, reverse biased leakage through the S/B or D/B diodes onto the sampling capacitor is significantly reduced. This reduction of the voltage of the bulk of the sampling switch also minimizes channel leakage through the sampling switch by minimizing its drain-to-source voltage ($v_{ds}$), in addition to lowering the maximum voltages seen on the capacitor. This reduction of the voltage improves reliability and therefore enables a more area efficient physical capacitor structure to be used. The circuits and methods has been verified to work across process, voltage and temperature (PVT), where it has been demonstrated to reduce leakage by over 2 orders of magnitude over conventional voltage divider implementations.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
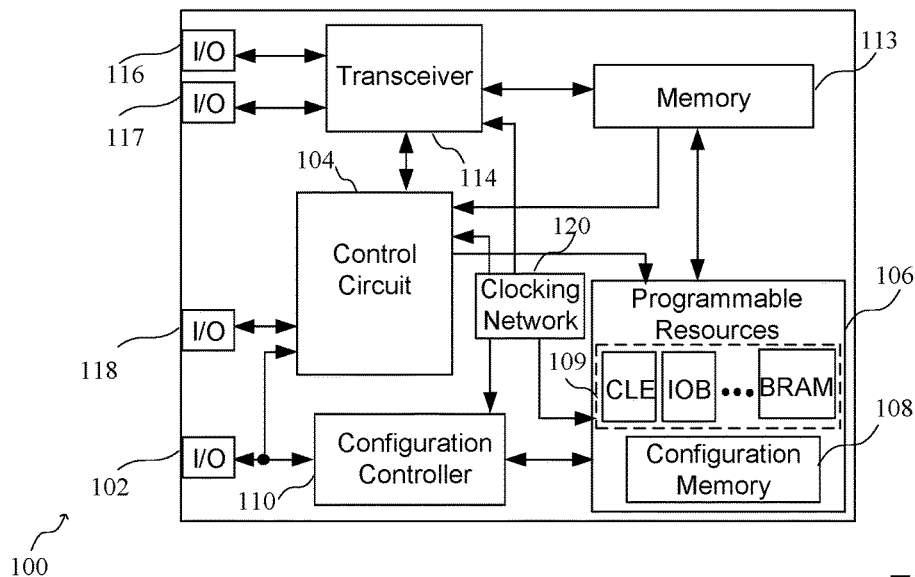
FIG. 1 is a block diagram of an integrated circuit having circuits that may require a voltage divider.

Turning first to FIG. 1, a block diagram of an integrated circuit having circuits that may require a voltage divider is shown. In particular, an input/output port 102 is coupled to a control circuit 104 that controls programmable resources 106 having configurable logic elements 109 and other programmable resources, such as input/output blocks (IOBs) and blocks of random access memory (BRAMs).

Configuration data may be provided to the configuration memory 108 by a configuration controller 110. The configuration data enables the operation of the programmable resources 106. A memory 113 may be coupled to the control circuit 104 and the programmable resources 106. A transceiver circuit 114, which comprises a transmitter and a receiver, may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1. The circuit of FIG. 1 includes examples of circuits that may require DC voltages to be stepped down, such as in an input/output port for example. While the circuit of FIG. 1 is provided by way of example, other circuits of implementing memory elements and other circuits requiring stepped down DC voltages.

Figure 2:
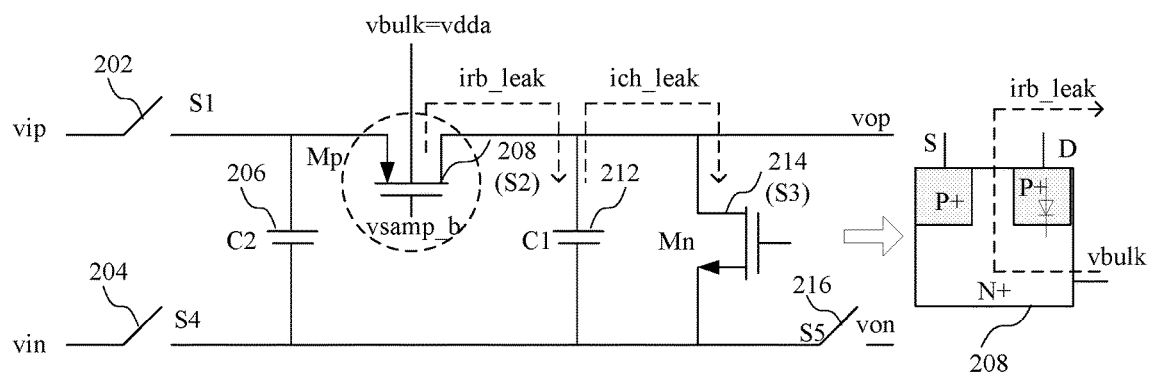
FIG. 2 is a block diagram showing leakage of a voltage divider having a 3-phase implementation.

Turning now to FIG. 2, a block diagram shows leakage of a conventional voltage divider implemented according to a 3-phase implementation. A plurality of switches including a first switch 202 (S1) and a second switch 204 (S4) enable coupling an input signal (Vip and Vin) to a capacitor 206 (C2). A switch 208 is coupled between a first terminal of the capacitor 206 and a terminal of a second capacitor 212 (C1). The first switch 208 and the second switch 210 enable charging a capacitor 206 (C2). An output signal Vop and von is generated at a first terminal of the capacitor 212 and a second terminal of the capacitor 212. A switch 214 is coupled in parallel with the capacitor 212, and a switch 216 is coupled between the second terminal of the capacitor 212 and the output for generating Von. During a first phase (i.e. a discharging phase), C1 is discharged by turning switch 202 (S1) off, switch 208 (S2) off, switch 214 (S3) on, switch 204 (S4) off, and switch 216 (S5) on. During a second phase (a sampling phase), the input signal is sampled onto C2 by turning switch 202 (S1) off, switch 208 (S2) on, switch 214 (S3) off, switch 204 (S4) on, and switch 216 (S5) off. During a third phase (a charge sharing phase), C1 is switched in (causing the input signal to be charge shared between C1 and C2) by turning switch 202 (S1) off, switch 208 (S2) on, switch 214 (S3) off, switch 204 (S4) off, and switch 216 (S5) on.

FIG. 2 shows two dominant leakage mechanisms found in conventional voltage dividers to be channel leakage (ich_leak) through the dis-charging switch 214 (S3) in its OFF state, and reverse biased leakage (irb_leak) from the bulk of the sampling switch (i.e. switch 208) onto capacitor 212. The net effect on the output voltage is:

$$dV = \left[\frac{\text{irb\_leak} - \text{ich\_leak}}{C1 + C2}\right] * dt \qquad \text{Eq. 1}$$

As this leakage constitutes a non-deterministic error source, it cannot be calibrated out, thus making the reduction of leakage in the voltage divider important for high precision systems. As will be described in more detail below, the voltage of the bulk may be reduced to reduce any reverse bias through the S/B or D/B diodes, as will be described in more detail below. The vbulk of transistor switch 208 (S2) maybe be a reference voltage, such as vdda. The irb_leak is shown by way of example on the rigth, where the leakage through the pn junction is shown through the N+ portion of the bulk and the P+ portion of the drain.

Figure 3:
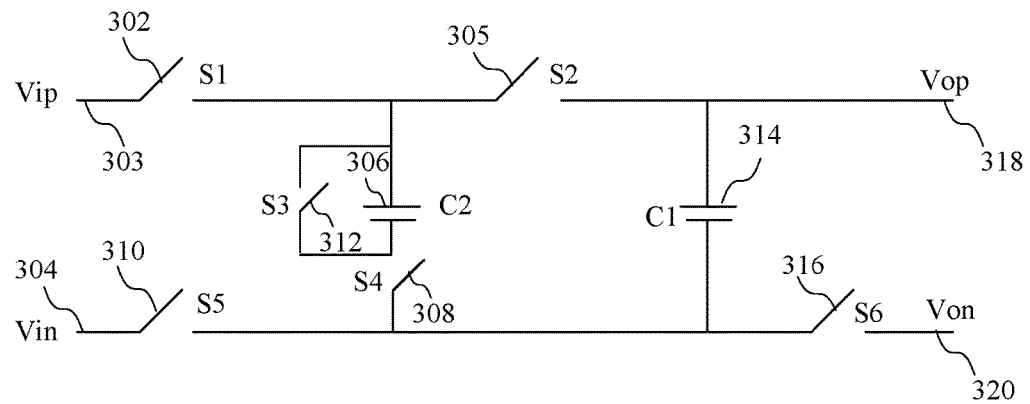
FIG. 3 is a block diagram of a voltage divider having a 4-phase implementation according to one implementation.

Turning now to FIG. 3, a block diagram of a voltage divider according to one implementation is shown. The circuit of FIG. 3 presents a new switched capacitor divider architecture to minimize leakage. The switched capacitor arrangement of FIG. 3 comprises a pair of inputs 303 and 304 and a pair of capacitors that are selectively charged and discharged using switches, such as transistor switches. Six switches are included, and enable a 4-phase charging/discharging operation that minimizes leakage. More particularly, a switch 302 (S1) is used for charging a capacitor 306 (C2), the charge of which may be transferred to capacitor 314 (C1) using a switch 305 (S2). A bypass switch 312 (S3) enables bypassing the capacitor C2, which operates as a discharge switch. A switch 308 (S4), which comprises a charge sharing switch, and switch 310 (S5) enable coupling a second terminal of the capacitor 306 (C2) to the Vin signal. The switch 316 (S6) enabling coupling the second terminal of the capacitor 314 to the Von output, where Vop is generated at a first output 318 of a pair of outputs and Von is generated at a second output 320 of the pair of outputs.

As shown in FIG. 3 shows the operation of the switched capacitor divider which can be divided into 4 phases. During a first phase known as a discharging phase, C2 is discharged and switched out. For example, when the voltage divider operates in the first phase, the bypass switch 312 (S3) is on; the charge sharing switch 308 (S4) is off; the third switch 302 (S1) is off; the fourth switch 305 (S2) is on; the fifth switch 310 (S5) is on; and the sixth switch 316 (S6) is off.

During a second phase known as a sampling phase, the input signal is sampled onto C1. When the voltage divider operates in the second phase, the bypass switch 312 (S3) is on; the charge sharing switch 308 (S4) is off; the third switch 302 (S1) is on; the fourth switch 305 (S2) is on; the fifth switch 310 (S5) is on; and the sixth switch 316 (S6) is off.

During a third phase, known as a charge sharing phase, C2 is switched in, causing the input signal to be charge shared between C1 and C2. Again, this divides down the input signal according the following equation:

$$\frac{Vout}{Vin} = \frac{C1}{C1 + C2} \qquad \text{Eq. 2}$$

where Vin is the difference between Vip and Vin and Vout is the difference between Vop and Von. When the voltage divider operates in a third phase, the bypass switch 312 (S3) is off; the charge sharing switch 308 (S4) is on; the third switch 302 (S1) is off; the fourth switch 305 (S2) is on; the fifth switch 310 (S5) is off; and the sixth switch 316 (S6) is on.

During a fourth phase, known as an output phase, C2 remains switched in but disconnected from the output (i.e. S2 is off). When the voltage divider operates in a fourth phase, the bypass switch 312 (S3) is off; the charge sharing switch 308 (S4) is on; the third switch 302 (S1) is off; the fourth switch 305 (S2) is off; the fifth switch 310 (S5) is off; and the sixth switch 316 (S6) is on. As a result, the stepped down voltage on C1 only (i.e. and not the voltage on C2) becomes available to the output.

Figure 4:
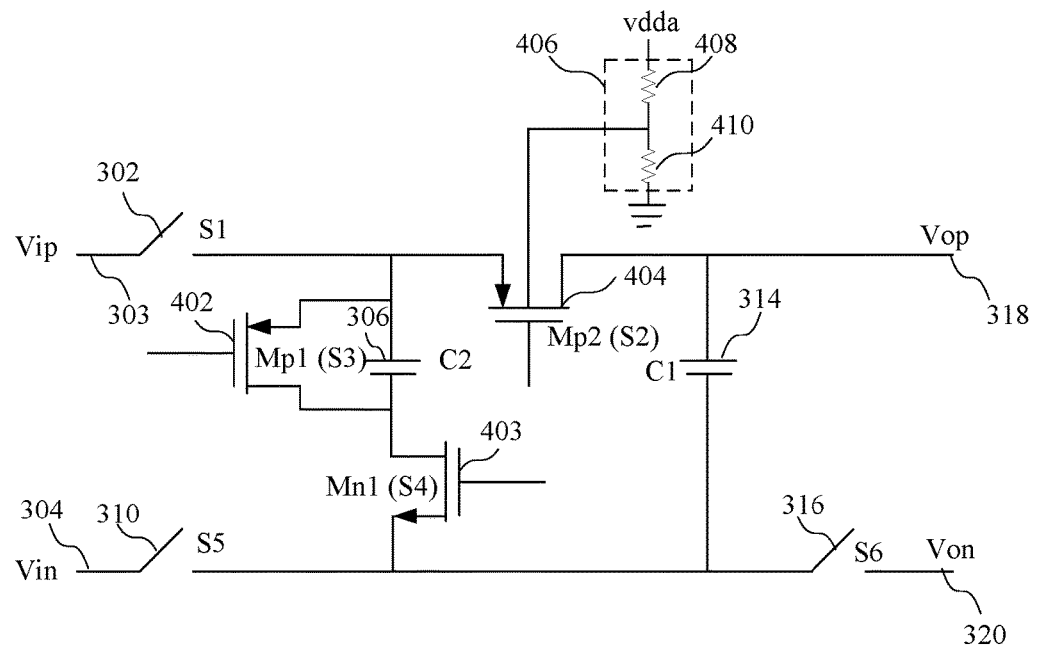
FIG. 4 is a block diagram of a voltage divider having a 4-phase implementation according to another implementation.

Turning now to FIG. 4, a block diagram of a voltage divider according to another implementation is shown. According to the implementation of FIG. 4, the bypass switch 312 (S3) is implemented as a PMOS transistor 402 (MP1), switch 308 (S4) is implemented as an NMOS transistor 403 (MN1), and switch 305 (S2) is implemented as a PMOS transistor 404 (MP2). That is, rather than having a fixed value such as vdda coupled to the bulk of the transistor, FIG. 4 enables minimizing leakage by controlling the voltage to the bulk of the transistor 404 using a voltage control circuit, shown by way of example as a voltage divider having resistors 408 and 410. Leakage off C1, due to the dis-charging of C2, is eliminated by placing the sampling switch MP2 between the dis-charging transistors 402 and 403 (MP1/MN) and C1. When the output is ready (after the fourth phase), MP2 is OFF, causing MP1/MN1 to be high impedance connected to C1. Reverse biased leakage onto C1 is also significantly reduced by reducing Vbulk of transistor 404 (MP2) close to Vop using the voltage control circuit 406. Reducing the bulk voltage minimizes leakage through MP2 because after the fourth phase, C2 remains switched in and charges up to Vbulk. Since Vbulk is close to Vop, the drain-to-source voltage (vds) of MP2 and hence the drain-to-source current (ids) of MP2 are reduced. Therefore, bulk voltage control reduces the maximum voltage seen on C2 from vdda to vbulk, which improves reliability, and hence enables a more area efficient physical capacitor structure to be used.

Figure 5:
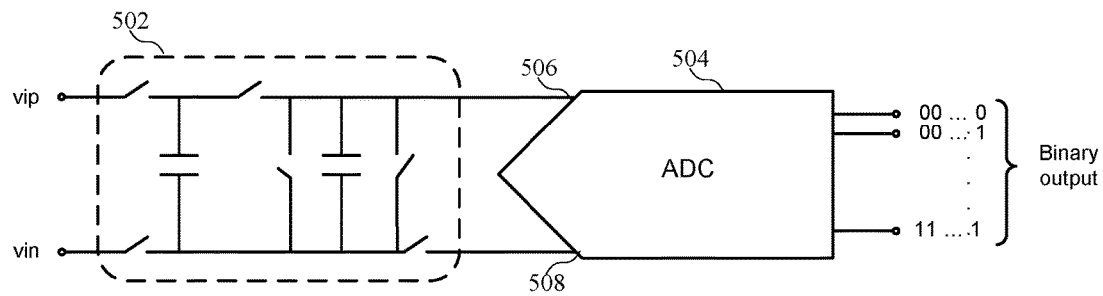
FIG. 5 is a block diagram of an application of a voltage divider using an analog-to-digital converter.
Figure 6:
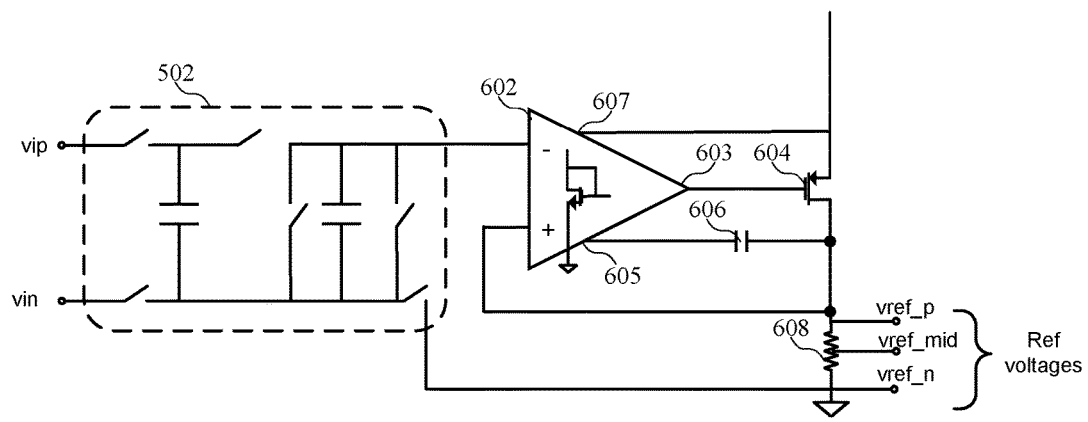
FIG. 6 is a block diagram of another application of a voltage divider with a reference voltage generator.

Turning now to FIGS. 5 and 6, block diagrams of applications of a voltage divider are shown. A voltage divider 502, such as the voltage divider shown in FIGS. 3 and 4, can be implemented at an input of an analog-to-digital converter 504 having a first input terminal 506 coupled to a first output terminal of the voltage divider 502 and a second input terminal 508 coupled to a second output terminal of the voltage divider 502, where binary outputs can be generated as shown. As shown in FIG. 6, the voltage divider can be used to generate reference voltages. More particularly, a comparator 602 is configured to receive the Vop signal at a first input, where an output 603 of the comparator is coupled to a gate of a PMOS transistor 604. A second output 605 of the comparator 602 is coupled to a first terminal of the capacitor 606, where a drain of the transistor 604 is coupled to a second terminal of a capacitor 606 and the source of the transistor 604 is coupled to an output 607 of the comparator 602. According to the implementation of FIG. 6, the comparator 602 can be implemented to generate reference voltages vref_p, vref_mid, and vref_n, where a resistor divider 608 enables generating vref_mid as shown. While FIGS. 3-6 illustrate the operation of the invention with respect to a differentially sampled system as used in most practical analog applications, it should be understood that the invention can be applied to a single ended system, where yin is received with respect to a ground, such as a global ground for example.

Figure 7:
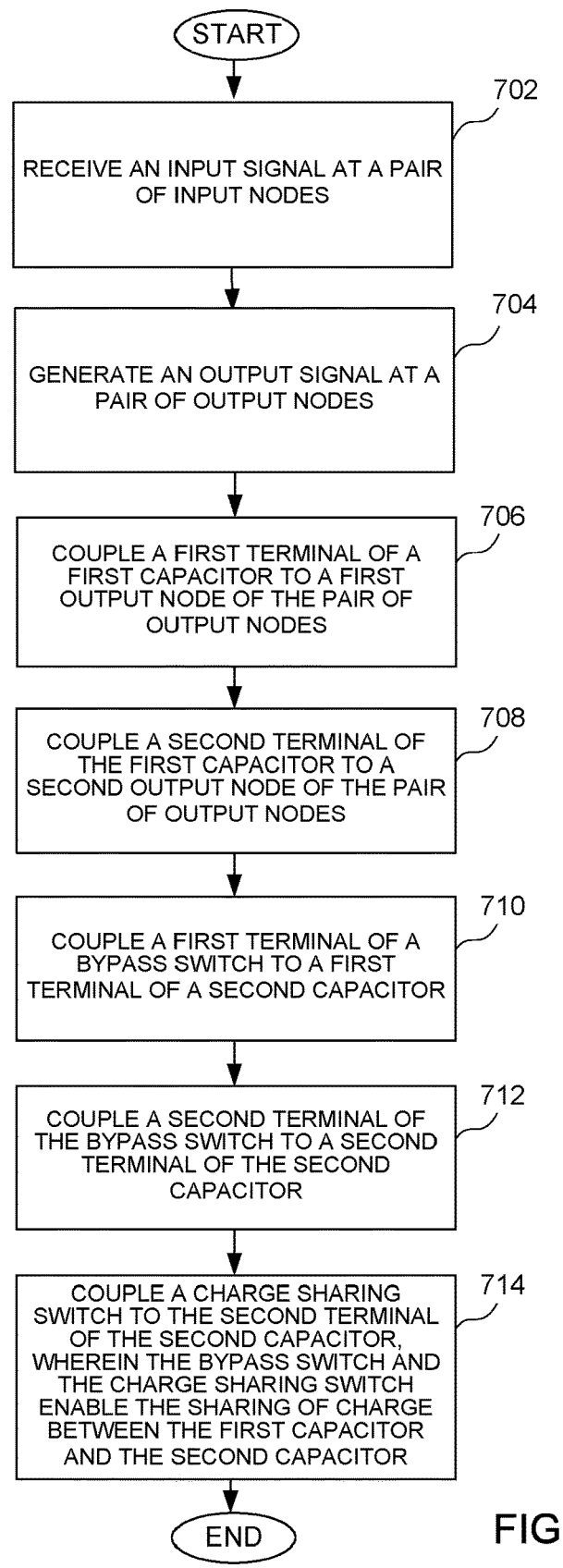
FIG. 7 is a flow chart showing a method of implementing a voltage divider in an integrated circuit device.

Turning now to FIG. 7, a flow chart shows a method of storing data in an integrated circuit device. More particularly, an input signal is received at a pair of input nodes at a block 702. An output signal is generated at a pair of output nodes at a block 704. The inputs could be Vip and Vin of FIGS. 3 and 4, while the outputs could be Vop and Von for example. A first terminal of a first capacitor, such as capacitor C1 of FIGS. 3 and 4, is coupled to a first output node of the pair of output nodes at a block 706. A second terminal of the first capacitor is coupled to a second output node of the pair of output nodes at a block 708. A first terminal of a bypass switch, such as switch 312, coupled to a first terminal of a second capacitor, such as capacitor C2 of FIGS. 3 and 4, at a block 710. A second terminal of the bypass switch coupled to a second terminal of the second capacitor at a block 712. A charge sharing switch, such as switch 308, is coupled to the second terminal of the second capacitor at a block 714, wherein the bypass switch and the charge sharing switch enable the sharing of charge between the first capacitor and the second capacitor.

The method of FIG. 7 may be implemented using the circuits of FIGS. 1-6 as described, or using some other suitable circuits, and can implement the 4 phases of voltage division as described above in reference to FIGS. 3 and 4. While specific elements of the method are described, it should be understood that additional elements of the method, or additional details related to the elements, could be implemented according to the disclosure of FIGS. 1-6.

It can therefore be appreciated that new circuits for and methods of implementing a voltage divider have been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. A voltage divider comprising:
a pair of input nodes for receiving an input signal;
a pair of output nodes configured to generate an output signal;
a first capacitor having a first terminal coupled to a first output node of the pair of output nodes and a second terminal coupled to a second output node of the pair of output nodes;
a second capacitor having first terminal and a second terminal;
a bypass switch having a first terminal coupled to the first terminal of the second capacitor and a second terminal coupled to the second terminal of the second capacitor;
a third switch coupled between the first terminal of the second capacitor at the first terminal of the bypass switch and the first output node of the pair of output nodes; and
a charge sharing switch coupled to the second terminal of the second capacitor;
wherein the bypass switch and the charge sharing switch enable the sharing of charge between the first capacitor and the second capacitor.

2. The voltage divider of claim 1, further comprising a fourth switch coupled between the first input node and the first terminal of the second capacitor.

3. The voltage divider of claim 1, further comprising a fifth switch coupled between the second input node and the second terminal of the second capacitor.

4. The voltage divider of claim 3, further comprising a sixth switch coupled between the second terminal of the second capacitor and the second output node.

5. The voltage divider of claim 4, wherein the voltage divider operates in a first phase comprising a discharge phase when:
the bypass switch is on;
the charge sharing switch is off;
the fourth switch is off;
the third switch is on;
the fifth switch is on; and
the sixth switch is off.

6. The voltage divider of claim 4, wherein the voltage divider operates in a second phase comprising a sampling phase when:
the bypass switch is on;
the charge sharing switch is off;
the fourth switch is on;
the third switch is on;
the fifth switch is on; and
the sixth switch is off.

7. The voltage divider of claim 4, wherein the voltage divider operates in a third phase comprising a charge sharing phase when:
- the bypass switch is off;
- the charge sharing switch is on;
- the fourth switch is off;
- the third switch is on;
- the fifth switch is off; and
- the sixth switch is on.

8. The voltage divider of claim 4, wherein the voltage divider operates in a fourth phase comprising an output phase when:
- the bypass switch is off;
- the charge sharing switch is on;
- the fourth switch is off;
- the third switch is off;
- the fifth switch is off; and
- the sixth switch is on.

9. The voltage divider of claim 1, further comprising an analog-to-digital converter having a first input terminal coupled to the first output terminal and a second input terminal coupled to the second output terminal.

10. A method of implementing a voltage divider, the method comprising:
- receiving an input signal at a pair of input nodes;
- generating an output signal at a pair of output nodes;
- coupling a first terminal of a first capacitor to a first output node of the pair of output nodes;
- coupling a second terminal of the first capacitor to a second output node of the pair of output nodes;
- coupling a first terminal of a bypass switch to a first terminal of a second capacitor;
- coupling a second terminal of the bypass switch to a second terminal of the second capacitor;
- coupling a third switch between the first terminal of the second capacitor at the first terminal of the bypass switch and the first output node of the pair of output nodes; and
- coupling a charge sharing switch to the second terminal of the second capacitor;
- wherein the bypass switch and the charge sharing switch enable the sharing of charge between the first capacitor and the second capacitor.

11. The method of claim 10, further comprising coupling a fourth switch between the first input node and the first terminal of the second capacitor.

12. The method of claim 10, further comprising coupling a fifth switch between the second input node and the second terminal of the second capacitor.

13. The method of claim 12, further comprising coupling a sixth switch between the second terminal of the second capacitor and the second output node.

14. The method of claim 13, further comprising operating the voltage divider in a first phase comprising a discharge phase when:
- the bypass switch is on;
- the charge sharing switch is off;
- the fourth switch is off;
- the third switch is on;
- the fifth switch is on; and
- the sixth switch is off.

15. The method of claim 13, further comprising operating the voltage divider in a second phase comprising a sampling phase when:
- the bypass switch is on;
- the charge sharing switch is off;
- the fourth switch is on;
- the third switch is on;
- the fifth switch is on; and
- the sixth switch is off.

16. The method of claim 13, further comprising operating the voltage divider in a third phase comprising a charge sharing phase when:
- the bypass switch is off;
- the charge sharing switch is on;
- the fourth switch is off;
- the third switch is on;
- the fifth switch is off; and
- the sixth switch is on.

17. The method of claim 13, further comprising operating the voltage divider in a fourth phase comprising an output phase when:
- the bypass switch is off;
- the charge sharing switch is on;
- the fourth switch is off;
- the third switch is off;
- the fifth switch is off; and
- the sixth switch is on.

18. The method of claim 10, further comprising coupling an analog-to-digital converter having a first input terminal to the first output terminal and a second input terminal coupled to the second output terminal.

\* \* \* \* \*